United States Patent [19]

McJilton

[11] Patent Number: 4,811,691
[45] Date of Patent: Mar. 14, 1989

[54] WIRE FEED FOR METALIZING APPARATUS

[75] Inventor: Timothy L. McJilton, St. Charles, Ill.
[73] Assignee: Shaped Wire, Inc., St. Charles, Ill.
[21] Appl. No.: 17,452
[22] Filed: Feb. 24, 1987
[51] Int. Cl.[4] .............................................. C23C 13/12
[52] U.S. Cl. .................................... 118/726; 219/273; 427/250
[58] Field of Search ................. 118/726; 219/273, 237
[56] References Cited

U.S. PATENT DOCUMENTS 2,914,643  11/1955  Fields ................................... 118/720
3,488,214  1/1970  Lius ..................................... 118/720

FOREIGN PATENT DOCUMENTS 0211071  10/1985  Japan ................................... 118/726

Primary Examiner—Sam Silverberg

[57] ABSTRACT

In metalizing apparatus employing wire as a source of metalizing material, wire with rectangular cross-section is employed and is fed toward the heated boat of the metalizing apparatus in a specific orientation. This cross-section tends to avoid kinking of the wire, clogging the guide tube which feeds the wire toward the boat, and reduces the criticalility of the hardness of the wire used in the metalizing process.

6 Claims, 1 Drawing Sheet

WIRE FEED FOR METALIZING APPARATUS

BACKGROUND

The present invention relates to an improved source of metalic material for metalizing apparatus.

It has been conventional in metalizing apparatus to use a source of metal in the form of a wire spool. The spool is mounted within a vacuum chamber, and unreeled to deliver the wire to a heated boat, where the wire is first melted into its liquid state and then vaporized. The spool is mounted in a position spaced away from the heated boat, so that only the terminal end of the wire is melted, as it reaches the boat. The spool is unreeled at a speed dependent on the metal input requirement for the metalizing process.

In order to guide the wire from the spool to the boat, a guide is employed, typically in the form of a tube having an interior diameter slightly larger than the cross-sectional dimensions of the wire, so that wire can be fed through the guide to the boat, as the spool is unwound.

During normal operation of conventional apparatus, the guide becomes clogged with metal material, which tends to accumulate and clog the outlet of the guide after some period of operation. This impedes the feeding of the wire from the spool to the boat, and in extreme cases can halt the feeding completely. In addition, the wire fed from the spool toward the boat tends to twist and kink, and the appearance of a severe kink can also halt the feeding of the wire. When the wire feeding is halted, the metalizing operation must be terminated, and maintenance performed on the wire feed within the vacuum chamber. This necessitates releasing the vacuum inside the metalizing chamber, whereby the vacuum must be restored later for subsequent operations. Thus, halting operation due to a malfunction in the wire feed is a costly and disadvantageous feature of conventional apparatus.

BRIEF SUMMARY OF THE INVENTION

It is a principle object of the present invention to provide an apparatus and method for eliminating the difficulties encountered with a conventional wire feed for metalizing apparatus.

Another object of the present invention is to provide an apparatus and method for minimizing clogging in the guide which is interposed between the wire source and the heated boat.

A further object of the present invention is to provide an apparatus and method for reducing the kinking tendency of a wire source of metalizing apparatus.

Another object of the invention is to provide increased speed of wire feeding in metalizing apparatus, with greater reliability.

In one embodiment of the present invention, the source of wire used in a metalizing process is provided with a rectangular cross-section which achieves the desirable and unexpected results of reducing or eliminating the clogging of the guide and reducing or eliminating the tendency of the wire to kink as it is fed toward the heated boat.

These and other objects and advantages of the present invention will become manifest by an inspection of the following description in the accompanying drawings.

BRIEF DESCRIPTION OF THE DRAWINGS

Reference will now be made to the accompanying drawings, in which.

DESCRIPTION OF THE PREFERRED EMBODIMENT

Figure 1:
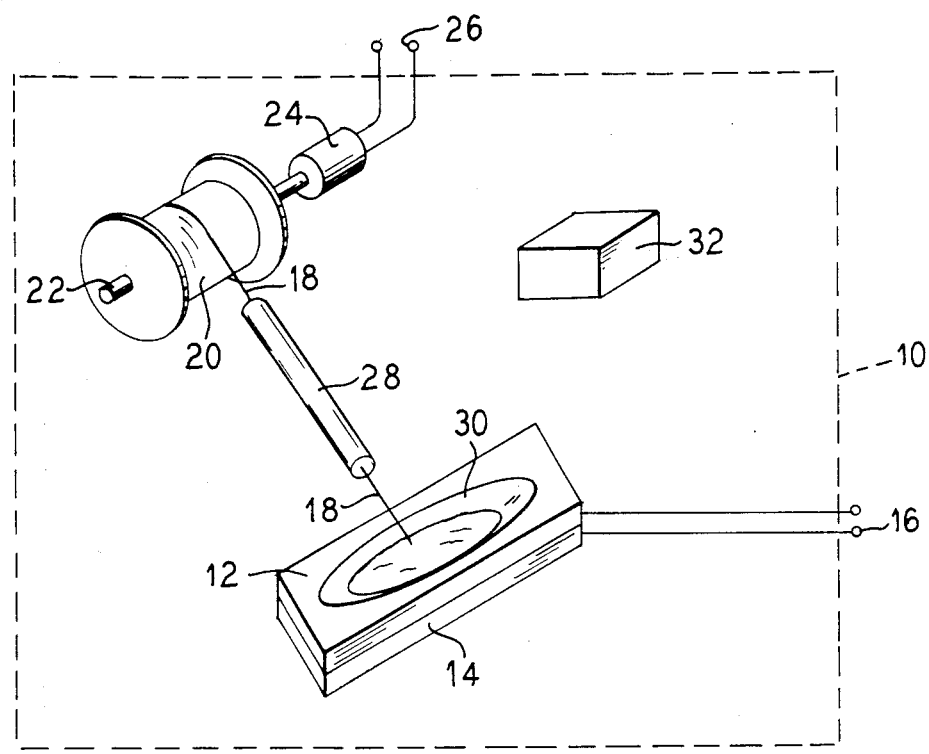
FIG. 1 is a perspective view of metalizing apparatus incorporating an illustrative embodiment of the present invention.

Referring now to FIG. 1, metalizing apparatus is illustrated incorporating a vacuum chamber 10, which has means (not shown) for evacuating the interior of the chamber. Within the chamber a boat 12 is disposed, and a heating element 14 is juxtaposed with the boat 12 to heat it. The heating element 14 is preferably electrical, and is powered by a source of external power through wires or conductors connected to external terminals 16.

A source of metalizing wire 18 is mounted on a reel 20, which is supported for rotation on a shaft 22 mounted within the vacuum chamber 10. The shaft 22 is turned by a motor 24, which is powered by a source of power connected by wires or conductors leading to terminals 26. Electrical energy is applied to the terminals 26, which causes the motor 24 to rotate the shaft 22 and unwind the wire 18 from the spool 20. A guide 28 is supported within the vacuum chamber 10 and takes the form of a hollow tube interposed between the boat 12 and the spool 20, for guiding the wire 18 toward the boat. The boat 12 has a dish or cavity 30 in its upper surface, and the wire 18 reaches the boat within the area of the cavity 30. The heating element 14 raises its temperature of the boat 12 to the melting point of the metallic wire 18, so that the wire melts and fills the cavity 30 with molten material. This material is vaporized and is deposited on the surface of an object 32 being metalized.

FIG. 1 is diagrammatic in nature, and omits the mounting hardware for mounting the units of the metalizing apparatus within the vacuum chamber. This mounting means is conventional in metalizing apparatus, and forms no part of the present invention, and therefore, need not be described in detail. Similarly, the means for supporting and/or conveying the articles 32 to be metalized, are conventional, and form no part of the present invention.

The wire 18 has a rectangular cross-section, and is wound on the reel 20 in even rows, with one of the rectangular dimensions aligned normal to the axis of the spool 20, so that as a spool 20 is unwound, the wire 18 has a specific orientation relative to the guide 28. This orientation is that in which one of the rectangular dimensions of the cross-section of the wire is parallel to the surface of the boat 12. The cross-section of the wire is illustrated in FIG. 2, and the manner in which the reel 20 is wound is illustrated in FIG. 3.

The guide 28 has one end located close to the reel 20, so that the wire 18 is captured by the guide 28 as soon as it is unreeled from the reel 20. The guide 28 is relatively straight, so that the curl in the wire as it leaves the reel 20 is straightened, resulting in a straight length of wire as it emerges the end of the guide 28 adjacent the boat 12.

It has been found that by using rectangular cross-section for the wire 18, there is no tendency for the wire 18 to kink either before it enters a guide 28, or after it leaves the guide 28, or within the guide itself. There is also a much reduced tendency for the end of the guide 28 adjacent the boat 12 to be clogged with material deposited from vapor. Accordingly, the speed of the wire feed can be increased, resulting in faster performance of the metalizing process and/or providing a thicker coat of metal on the materials being metalized.

Figure 2:
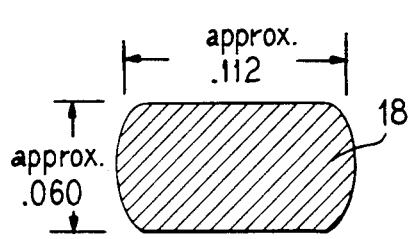
FIG. 2 is a cross-sectional illustration of the wire used in the apparatus of FIG. 1.
Figure 3:
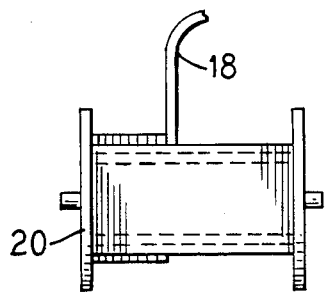

Another completely unexpected benefit of the present invention, is that the hardness of the wire 18 becomes less critical when the rectangular cross-section of FIG. 2 is employed. In conventional metalizing apparatus, wire of a specific hardness is required, in order to obtain proper operation of the metalizing apparatus. This hardness is conventionally achieved by heat treating the wire between two separate drawing steps. The heat treatment, and the need for multiple drawings steps, represent necessary steps in the preparation of the wire for use with metalizing apparatus. If the wire is not hardened in this manner, it is too soft for proper operation in conventional metalizing apparatus, leading to rapid clogging of the guide tube 28, and or kinking of the wire as it is fed toward the boat. However, the harder wire is stiffer, and thus is more difficult to feed.

It has been found that when a rectangular cross-section is employed for the wire, soft wire may be employed, making unnecessary the step of hardening the wire before it can be used in metalizing apparatus.

Conventionally, when the wire is 1100 series aluminum, a hardness of H18 is required, and the wire is drawn to 0.062 inch or 1.57 mm. With the present invention the wire may be used without any hardness specifications, with satisfactory results.

The rectangular cross-section of FIG. 2 is obtained by rolling round wire, between metal rollers so as to given two parallel flat sides, and a generally rectangular cross-section as shown in FIG. 2. Because the rollers may be disposed in line with the wire drawing apparatus or other apparatus for manufacturing the wire 18, it does not slow preparation of the wire 18 for use in metalizing apparatus, and so does not add appreciably to the cost of manufacture of the wire. The relatively large cost of hardening by a heat treating step is eliminated, along with the time required for such step.

The use of wire with rectangular cross-section also greatly facilitates spooling of the wire after manufacture, because the rectangular wire is much easier to spool than wire with a round cross-section.

It is also within the scope of the present invention to provide a length of wire having at least one flattened side, formed, for example, by drawing wire stock through a D-shaped die, or by passing the wire stock through a pair of shaped rollers, one to flatten one portion of the wire surface and the other with a concave surface to maintain a rounded shape on the rest of the wire surface. Wire formed with at least one flat side in this manner is much easier to spool, with the flat surface facing inwardly as the wire is spooled. During the metalizing process, the wire spool is oriented so that the wire end approaching the boat has its flat surface facing toward the boat.

It is apparent that various modifications and additions may be made in the apparatus and method of the present invention without departing from the essential features of novelty thereof, which are intended to be defined and secured by the appended claims.

What is claimed is:

1. Metalizing apparatus comprising, in combination a heated boat, a source of metal in the form of a wire a guide tube for receiving and guiding said wire toward said boat, said guide tube comprising a hollow tube with interior dimensions larger than the dimensions of said wire, a means for feeding said wire longitudinally through said tube and toward said boat whereby the material of said wire is melted and vaporized, said wire comprising an elongate length of material having a generally rectangular cross-section.

2. Metalizing apparatus comprising in combination a heated boat, a source of metal in the form of a wire, a reel for supporting said wire, means for mounting said reel generally in parallel to a heated surface of said boat, said wire being wound on said reel so that one of its rectangular dimensions is normal to the axis of said reel whereby this portion of the cross section stays in a plane generally perpendicular to said surface of said boat, a means for feeding said wire longitudinally toward said boat whereby the material of said wire is melted and vaporized said wire comprising an elongate body having a generally rectangular cross section.

3. Metalizing apparatus comprising, in combination a heated boat, a source of metal in the form of a wire, a means for feeding said wire longitudinally towards said boat whereby the material of said wire is melted and vaporized, said wire comprising an elongate body having at least one flat side, said means for feeding includes a spool having said wire wound on said spool with a flat side of the wire facing inwardly and said wire spool is oriented so said wire end approaching the boat has a flat surface facing toward the boat.

4. Apparatus according to claim 3, wherein said wire has one flat side and the remainder of said wire is a rounded cross section.

5. Apparatus according to claim 3, wherein said wire has a hardness below that of a wire which has been hardened by a heat treatment process.

6. Apparatus according to claim 5, wherein said wire has a rectangular cross section formed by rolling round wire between two parallel rollers.

* * * * *